(12) United States Patent
Kuo et al.

(10) Patent No.: US 9,846,755 B2
(45) Date of Patent: Dec. 19, 2017

(54) METHOD FOR CELL PLACEMENT IN SEMICONDUCTOR LAYOUT AND SYSTEM THEREOF (71) Applicant: Taiwan Semiconductor Manufacturing Company Limited, Hsinchu (TW)

(72) Inventors: Ming-Zhang Kuo, Hsinchu County (TW); Lee-Chung Lu, Taipei (TW); Cheng-Chung Lin, Hsinchu (TW); Li-Chun Tien, Tainan (TW); Sang-Hoo Dhong, Hsinchu (TW); Ta-Pen Guo, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 161 days.

(21) Appl. No.: 14/688,033

(22) Filed: Apr. 16, 2015

(65) Prior Publication Data

US 2016/0306911 A1  Oct. 20, 2016

(51) Int. Cl.
*G06F 17/50* (2006.01)

(52) U.S. Cl.
CPC ................ *G06F 17/5072* (2013.01)

(58) Field of Classification Search
USPC ........................................................ 716/122
See application file for complete search history.

(56) References Cited

U.S. PATENT DOCUMENTS

| 8,560,997 B1* | 10/2013 | Yang ................... G06F 17/5072 716/122 |
| 2009/0083686 A1 | 3/2009 | Itaka et al. |
| 2009/0271752 A1 | 10/2009 | Alpert et al. |
| 2010/0269081 A1* | 10/2010 | Hou ................... G06F 17/5068 716/123 |

FOREIGN PATENT DOCUMENTS

TW  1365391  6/2012

OTHER PUBLICATIONS

Taiwan Office Action; Application No. 104139956; dated Dec. 22, 2016.
Korean Office Action; Application No: 10-2015-0165582; dated Apr. 6, 2017.

* cited by examiner

*Primary Examiner* — Bryce Aisaka
(74) *Attorney, Agent, or Firm* — Jones Day (57) ABSTRACT

According to an embodiment, a method for cell placement in a semiconductor layout is provided. The method includes: providing a first cell having two sides, each side configured as at least one of a source side and a drain side; providing a place-and-route boundary (prBoundary) of the first cell based on the configuration of the two sides of the first cell; providing a second cell having two sides, each side configured as at least one of a source side and a drain side; providing a prBoundary of the second cell based on the configuration of the two sides of the second cell; and placing the first cell and the second cell based on the prBoundary of the first cell and the prBoundary of the second cell.

20 Claims, 10 Drawing Sheets

METHOD FOR CELL PLACEMENT IN SEMICONDUCTOR LAYOUT AND SYSTEM THEREOF

BACKGROUND

In ASIC flow, cell libraries include standard cells with different logic functions. Standard cells are placed at specific locations to meet timing and area requirements. The cell boundary of each standard cell is defined to avoid design rule violations when cells are abutted. Cell area is calculated according to the cell boundary. Therefore, cell boundary drawing in standard cell layout affects the chip area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This invention is related to the place-and-route boundary ("prBoundary") in a standard cell. In general, all of the standard cells in a cell library have the same cell height. With larger cell height, more active area for PMOS and NMOS makes the chip speed performance better but with a larger area. Cell width is related to the number of transistors used in the standard cell. A cell with complex functions has more transistors and takes a greater number of poly pitches to implement. Cell boundary definition affects the chip area as well as the chip performance.

The cell libraries, such as an AND cell, OR cell, NAND cell, NOR cell, flip flop cell, XOR cell, and INV cell, are laid out in a semiconductor layout environment such that respective cells are abutted according to a place-and-route boundary. The cells are generally abutted against a prBoundary of another cell. For example, if a first cell is on a left side and a second cell is on a right side, a prBoundary placement configuration requires a prBoundary for the first cell to be abutted against a prBoundary for the second cell during cell placement.

This disclosure includes three types of standard cell layouts based on their configuration of the two sides, for example, a source-source type, a drain-source type, and a drain-drain type. The source-source type refers to two sides of the cell having all source sides. The drain-source type refers to one side of the cell having the drain side and the other side having the source side. The drain-drain type refers to two sides of the cell having all drain sides. The source side means that the active area thereof is connected to a power domain. For example, PMOS at the source side is connected to the power supply (VDD), and NMOS at the source side is connected to the ground (VSS). The source sides between cells could be shared or overlap. However, the drain sides between cells could not be shared and shall not be connected to the source side of other cells.

In some embodiments, to prevent the source side of one cell being short to the drain side of another cell, the prBoundary is defined on the middle of poly gates at two sides of the cells. By doing this, source and drain are separated by a poly gate when cells are abutted. In some embodiments, instead of the middle of poly gates, the prBoundary at the source side is defined at the active area (OD) which is connected to the power domain. The prBoundary at the drain side is defined at one poly pitch away from the drain side in order to prevent the drain being short to the power domain when cells are abutted.

Figure 1:
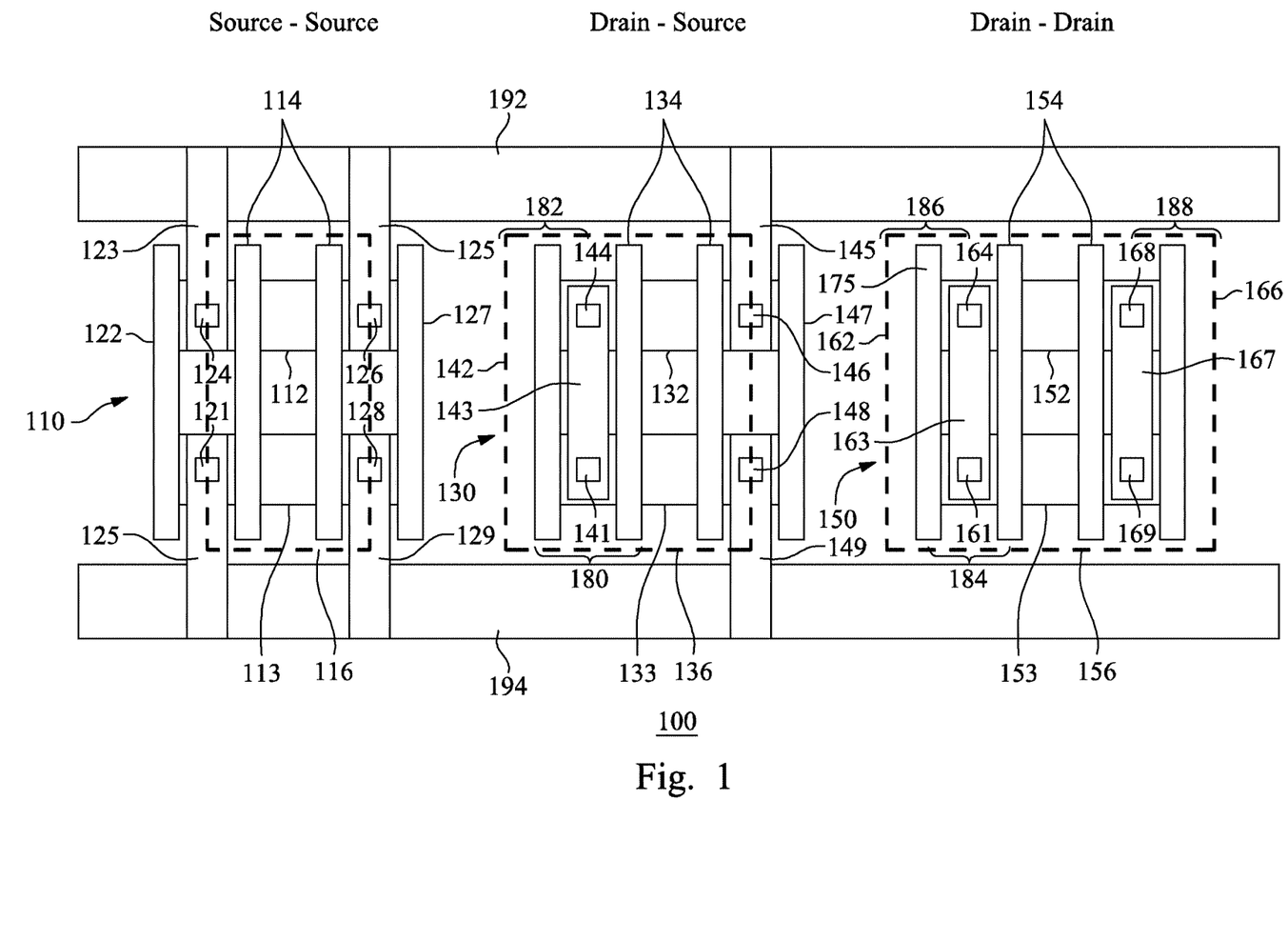
FIG. 1 is a block diagram of an exemplary semiconductor layout in accordance with some embodiments.

FIG. 1 is a block diagram of an exemplary semiconductor layout in accordance with some embodiments. As shown in FIG. 1, a semiconductor layout 100 is provided. This layout 100 includes a source-source type standard cell 110, a drain-source type standard cell 130, and a drain-drain type standard cell 150. Each of the standard cells 110, 130, 150 has respective active areas (OD) 112-113, 132-133, 152-153, respective poly gates 114, 134, 154, and respective prBoundaries 116, 136, 156.

The side 122 of the source-source type standard cell 110 is defined as a source side because the active area 112 of the side 122 is connected to the power supply 192 by using the metal layer 123 and the via 124, and the active area 113 of the side 122 is connected to the ground 194 by using the metal layer 125 and the via 121. The side 127 of the source-source type standard cell 110 is defined as a source side for similar configurations. Based on the configurations of the source sides 122, 127, the prBoundary 116 is determined. At the source side 122 of the source-source type standard cell 110, the prBoundary 116 overlaps the active areas 112, 113 and the vias 124, 121. At another source side 127 of the source-source type standard cell 110, the prBoundary 116 overlaps the active area 112, 113 and the vias 126, 128.

The side 142 of the drain-source type standard cell 130 is defined as a drain side because the active area 132 of the side 142 is connected to the active area 133 of the side 142 by using the metal layer 143 and the vias 144, 141. The side 147 of the drain-source type standard cell 130 is defined as a source side because the active area 132 of the side 147 is connected to the power supply 192 by using the metal layer 145 and the via 146, and the active area 133 of the side 147 is connected to the ground 194 by using the metal layer 149 and the via 148. Based on the configuration of the drain side 142 and the source side 147, the prBoundary 136 is determined. At the source side 147 of the drain-source type standard cell 130, the prBoundary 136 overlaps the active areas 132, 133 and the vias 146, 148. At the drain side 142 of the drain-source type standard cell 130, the prBoundary 136 is separated from the active areas 132, 133. Moreover, the prBoundary 136 is separated from the active areas 132 by a unit distance 182 relative to a pitch 180 of the poly gates 134.

The side 162 of the drain-drain type standard cell 150 is defined as a drain side because the active area 152 of the side 162 is connected to the active area 153 of the side 162 by using the metal layer 163 and the vias 164, 161. The side 166 of the drain-drain type standard cell 150 is defined as a drain side because the active area 152 of the side 166 is connected to the active area 153 of the side 166 by using the metal layer 167 and the vias 168, 169. Based on the configuration of the drain sides 162, 166, the prBoundary 156 is determined. At the drain side 162 of the drain-drain type standard cell 150, the prBoundary 156 is separated from the active areas 152, 153. Moreover, the prBoundary 156 is separated from the active areas 152 by a unit distance 186 relative to a pitch 184 of the poly gates 154. On the other hand, at the drain side 166 of the drain-drain type standard cell 150, the prBoundary 156 is separated from the active areas 152, 153. Moreover, the prBoundary 156 is separated from the active areas 152 by a unit distance 188 relative to a pitch 184 of the poly gates 154.

Figure 2:
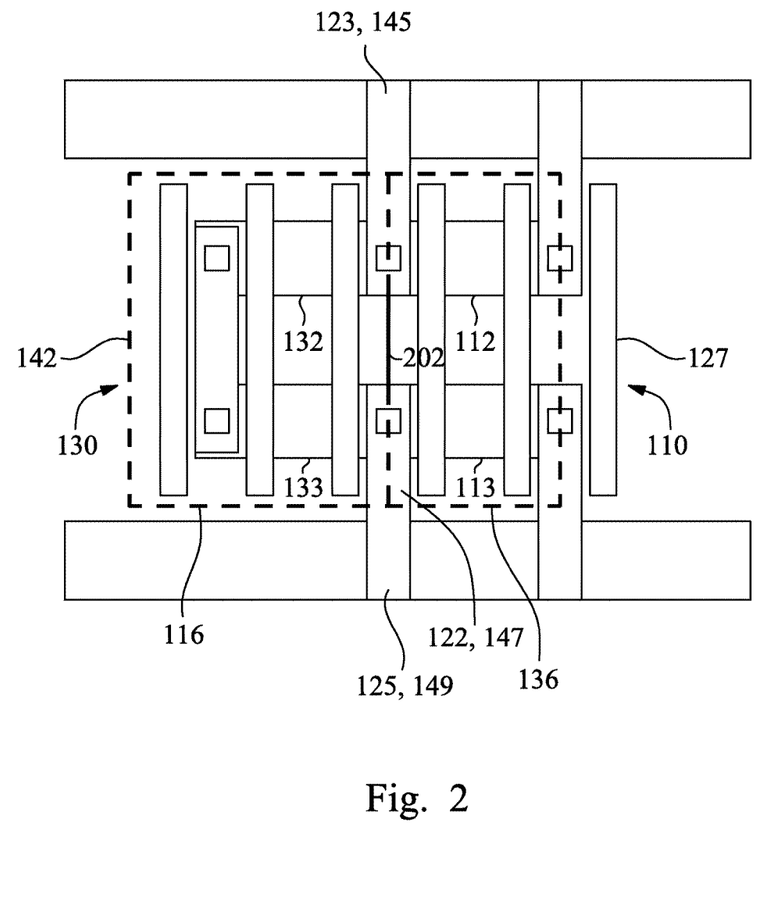
FIG. 2 is a block diagram of an exemplary semiconductor layout in accordance with some embodiments.

FIG. 2 is a block diagram of an exemplary semiconductor layout in accordance with some embodiments. As shown in FIG. 2, the standard cells 110, 130 are placed by aligning the prBoundarys 116, 136. In the embodiment, the source side 122 of the standard cell 110 and the source side 147 of the standard cell 130 are aligned, the active area 112 of the standard cell 110 overlaps the active area 132 of the standard cell 130, and the active area 113 of the standard cell 110 overlaps the active area 133 of the standard cell 130. Additionally, the metal layers 123, 145 overlap, and the metal layers 125, 149 overlap. Therefore, due to the prBoundary configuration in the disclosure, the standard cells 110, 130 merge, so that there is minimal space wasted therebetween, resulting in reduction of chip area.

Figure 3:
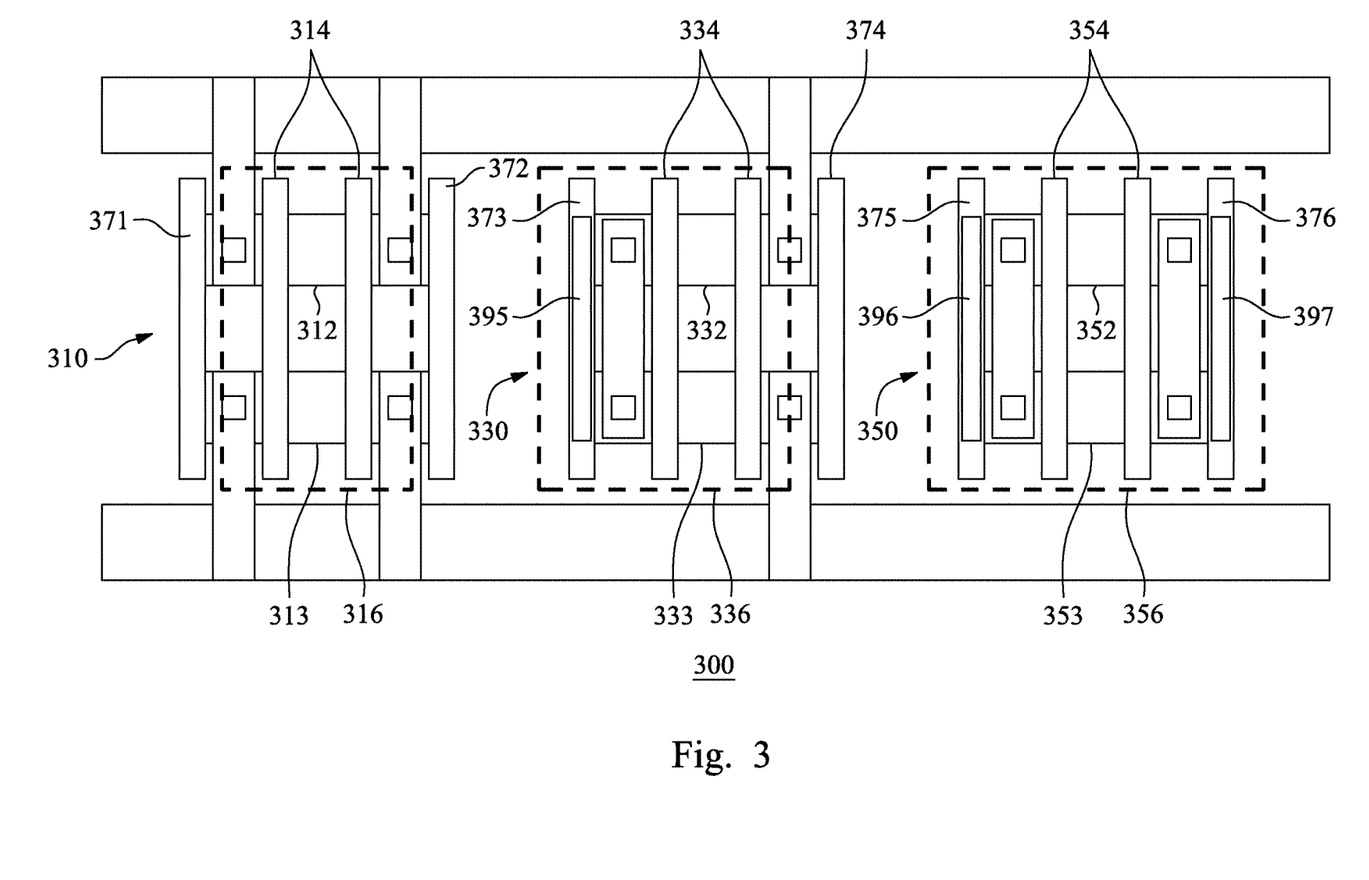
FIG. 3 is a block diagram of an exemplary semiconductor layout in accordance with some embodiments.

FIG. 3 is a block diagram of an exemplary semiconductor layout in accordance with some embodiments. As shown in FIG. 3, a semiconductor layout 300 is provided. This layout 300 includes a source-source type standard cell 310, a drain-source type standard cell 330, and a drain-drain type standard cell 350. Each of the standard cells 310, 330, 350 has respective active areas (OD) 312-313, 332-333, 352-353, respective poly gates 314, 334, 354, and respective prBoundarys 316, 336, 356.

The active area in FIG. 3 is connected to a dummy poly gate in contrast to FIG. 1 where the active area is not connected to a dummy poly gate. For example, in the source-source type standard cell 310, the active area 312 of the standard cell 310 is connected to dummy poly gates 371-372; in the drain-source type standard cell 330, the active area 332 of the standard cell 330 is connected to dummy poly gates 373-374; and in the drain-drain type standard cell 350, the active area 352 of the standard cell 350 is connected to dummy poly gates 375-376. Additionally connection between the active area and the dummy gate may produce an unexpected electrical short. Cad layers 395-397 may be utilized as a marker to remove a portion of the dummy gates, preventing the unexpected short.

Figure 4:
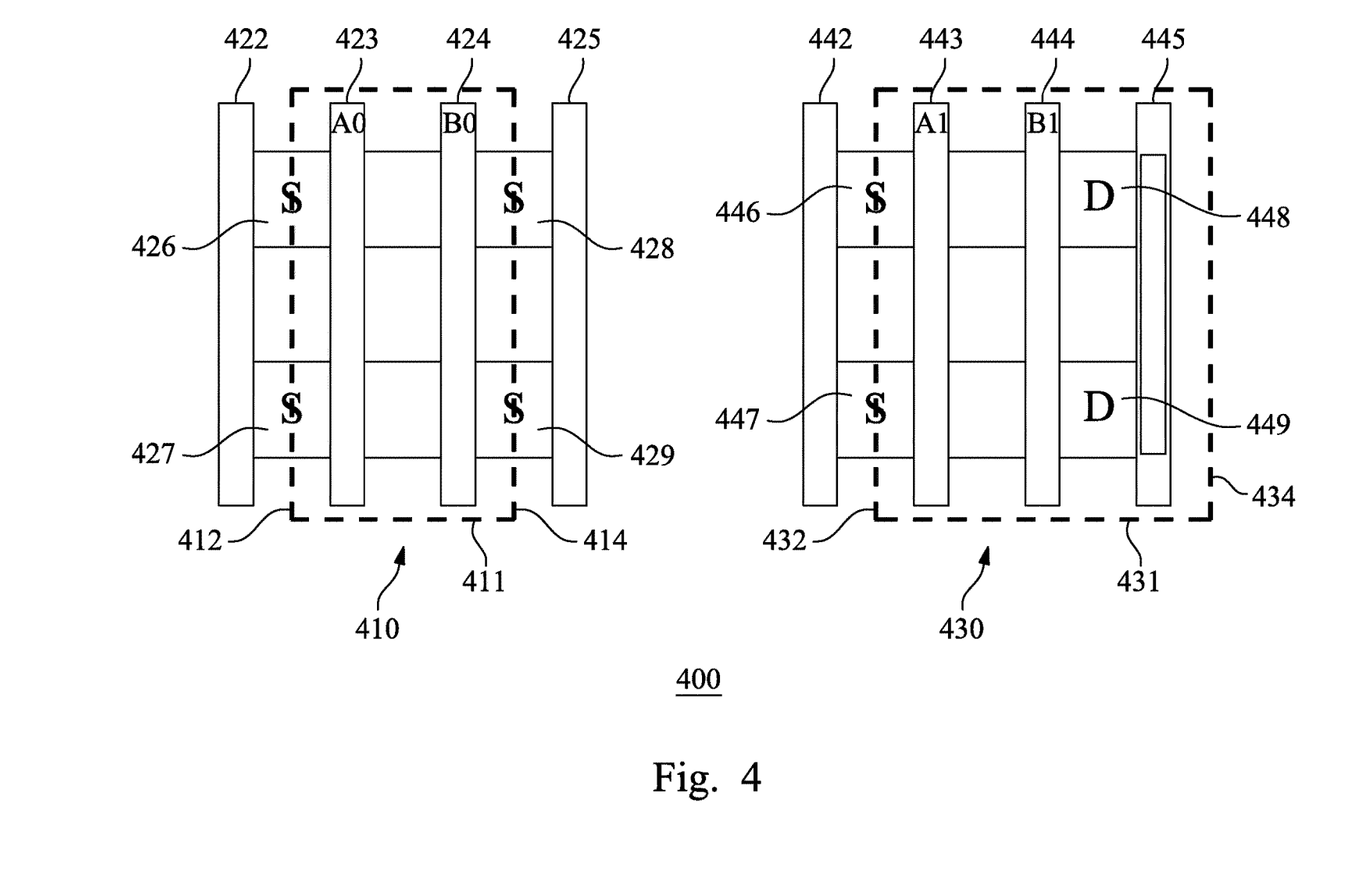
FIG. 4 is a block diagram of an exemplary semiconductor layout in accordance with some embodiments.

FIG. 4 is a block diagram of an exemplary semiconductor layout in accordance with some embodiments. As shown in FIG. 4, a semiconductor layout 400 is provided. Similar to the layout 300 in FIG. 3, the layout 400 includes a simplified source-source type standard cell 410 and a simplified drain-source type standard cell 430. In order to focus on the placement between the standard cells 410, 430, we omit the metal layers and vias. Each of the standard cells 410, 430 has respective active areas (OD) 426-429, 446-449, respective poly gates 422-425, 442-445, and respective prBoundaries 411, 431. Each of the prBoundaries 411, 431 has respective edges 412, 414 and 432, 434.

Figure 5:
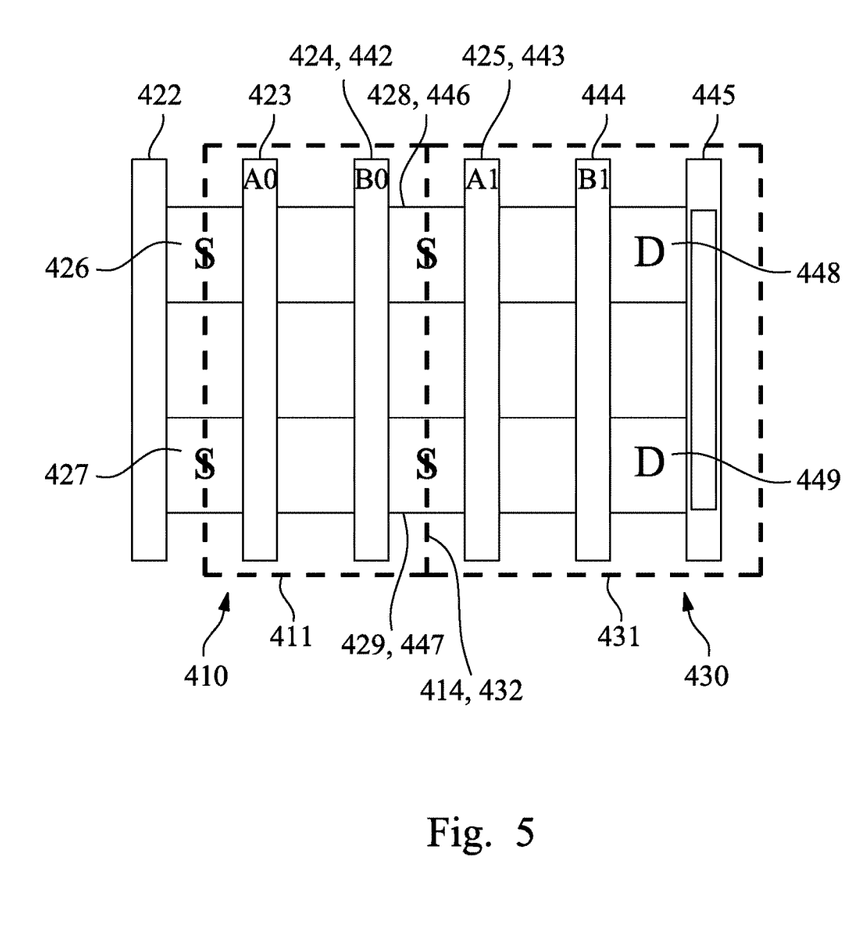
FIG. 5 is a block diagram of an exemplary semiconductor layout in accordance with some embodiments.

FIG. 5 is a block diagram of an exemplary semiconductor layout in accordance with some embodiments. Please also refer to FIGS. 4 and 5. By aligning a right prBoundary edge 414 of the standard cell 410 and a left prBoundary edge 432 of the standard cells 430, the standard cells 410, 430 merge. Consequently, the poly gate 424 of the standard cells 410 overlaps the poly gate 442 of the standard cells 430. The poly gate 425 of the standard cells 410 overlaps the poly gate 443 of the standard cells 430. The active area 428 of the standard cells 410 overlaps the active area 446 of the standard cells 430. The active area 429 of the standard cells 410 overlaps the active area 447 of the standard cells 430. Therefore, due to the prBoundary configuration in the disclosure, the standard cells 410, 430 merge, so that there is minimal space wasted therebetween, resulting in reduction of chip area.

Figure 6:
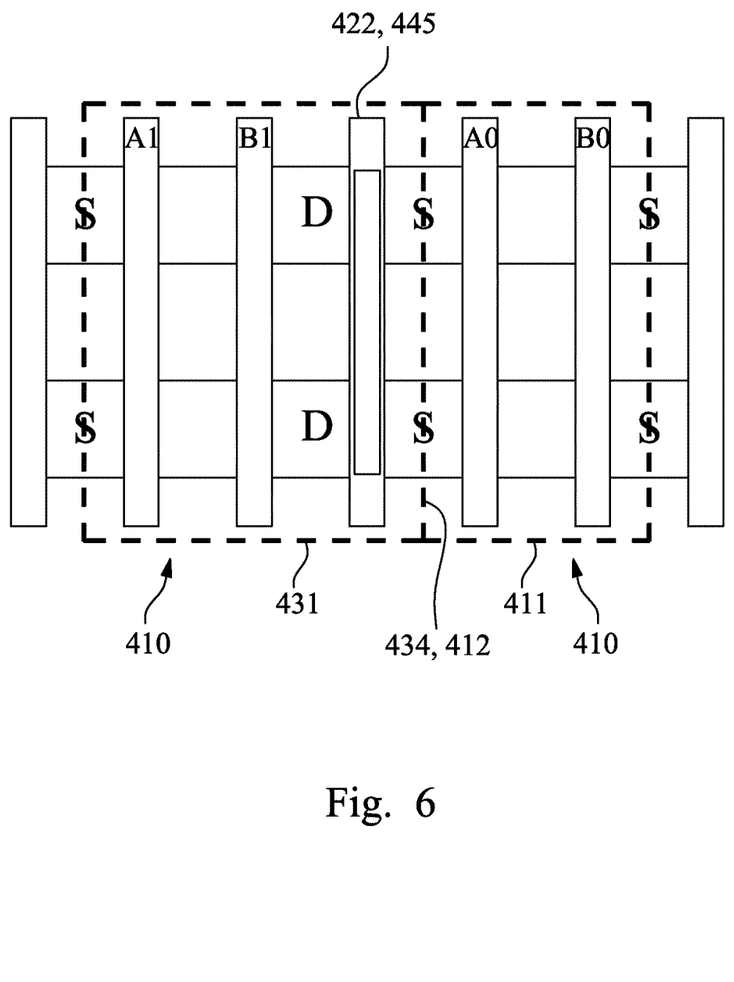
FIG. 6 is a block diagram of an exemplary semiconductor layout in accordance with some embodiments.

FIG. 6 is a block diagram of an exemplary semiconductor layout in accordance with some embodiments. Please refer to FIGS. 4 and 6. By aligning a right prBoundary edge 434 of the standard cell 430 and a left prBoundary edge 412 of the standard cells 410, the standard cells 410, 430 merge. For example, the poly gate 422 of the standard cells 410 overlaps the poly gate 445 of the standard cells 430.

Figure 7:
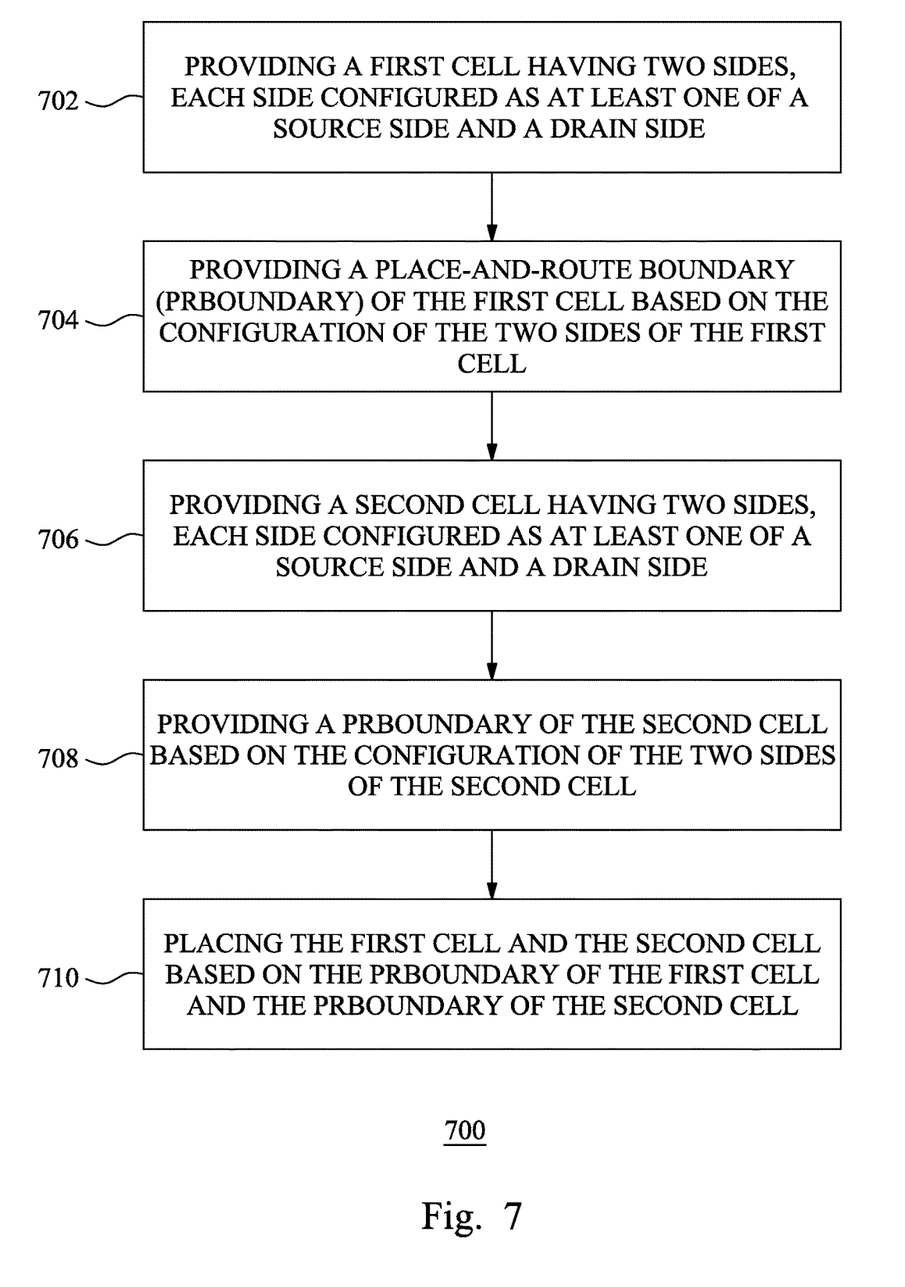
FIG. 7 is a flow chart of a method for cell placement in a semiconductor layout in accordance with some embodiments.

FIG. 7 is a flow chart of a method for cell placement in a semiconductor layout in accordance with some embodiments. A method 700 for cell placement in a semiconductor layout is provided. First, the method 700 includes providing a first cell having two sides (702). Each side is configured as at least one of a source side and a drain side. Then, the operation 704 of providing a place-and-route boundary (prBoundary) of the first cell based on the configuration of the two sides of the first cell takes place. Moreover, the method 700 includes providing a second cell having two sides (706). Each side configured as at least one of a source side and a drain side. Next, the method 700 goes to the operation 708 of providing a prBoundary of the second cell based on the configuration of the two sides of the second cell. Furthermore, the method 700 includes placing the first cell and the second cell based on the prBoundary of the first cell and the prBoundary of the second cell (710).

Figure 8:
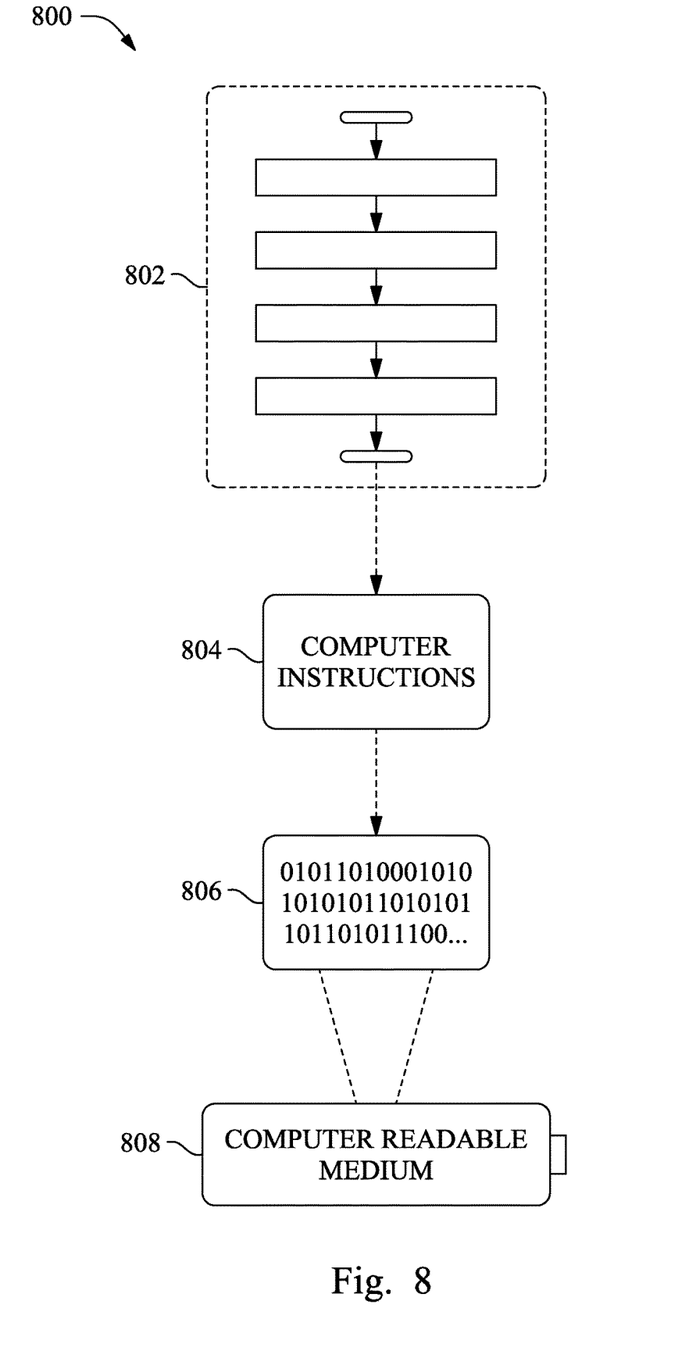
FIG. 8 is a block diagram of an exemplary computer-readable medium or computer-readable device comprising processor-executable instructions in accordance with some embodiments.

Still another embodiment involves a computer-readable medium comprising processor-executable instructions configured to implement one or more of the techniques presented herein. An exemplary embodiment of a computer-readable medium or a computer-readable device that is devised in these ways is illustrated in FIG. 8, wherein the implementation 800 comprises a computer-readable medium 808, such as a CD-R, DVD-R, flash drive, a platter of a hard disk drive, etc., on which is encoded computer-readable data 806. This computer-readable data 806 in turn comprises a set of computer instructions 804 configured to operate according to one or more of the principles set forth herein. In an embodiment 800, the processor-executable computer instructions 804 are configured to perform a method 802, such as at least some of the exemplary method 700 of FIG. 7. In another embodiment, the processor-executable computer instructions 804 are configured to implement a system, such as at least some of the exemplary system 1000 of the following FIG. 10, for example. Many such computer-readable media are devised by those of ordinary skill in the art that are configured to operate in accordance with the techniques presented herein.

As used in this application, the terms "component", "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, or a computer. By way of illustration, both an application running on a controller and the controller can be a component. One or more components residing within a process or thread of execution and a component may be localized on one computer or distributed between two or more computers.

Figure 9:
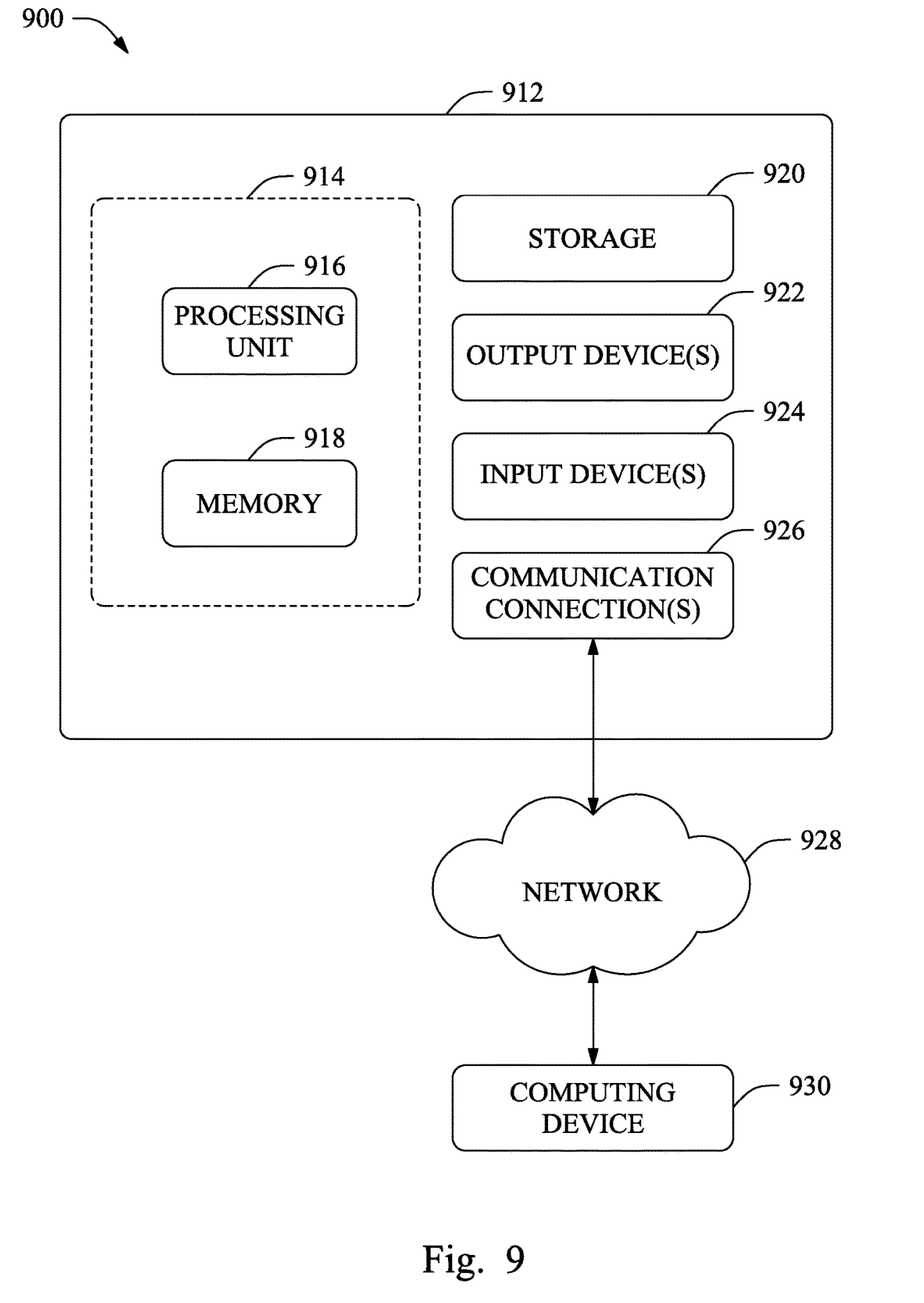
FIG. 9 is a block diagram of an exemplary computing environment in accordance with some embodiments.

FIG. 9 and the following discussion provide a brief, general description of a suitable computing environment to implement embodiments of one or more of the provisions set forth herein. The operating environment of FIG. 9 is only one example of a suitable operating environment and is not intended to suggest any limitation as to the scope of use or functionality of the operating environment. Exemplary computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 9 illustrates an example of a system 900 comprising a computing device 912 configured to implement one or more embodiments provided herein. In one configuration, computing device 912 includes at least one processing unit 916 and memory 918. Depending on the exact configuration and type of computing device, memory 918 may be volatile, such as RAM, non-volatile, such as ROM, flash memory, or some combination of the two. This configuration is illustrated in FIG. 9 by dashed line 914.

In other embodiments, device 912 includes additional features or functionality. For example, device 912 also includes additional storage such as removable storage or non-removable storage, including, but not limited to, magnetic storage, optical storage, and the like. Such additional storage is illustrated in FIG. 9 by storage 920. In an embodiment, computer readable instructions to implement one or more embodiments provided herein are in storage 920. Storage 920 also stores other computer readable instructions to implement an operating system, an application program, and the like. Computer readable instructions are loaded in memory 918 for execution by processing unit 916, for example.

The term "computer readable media" as used herein includes computer storage media. Computer storage media includes volatile and nonvolatile, removable and non-removable media implemented in any method or technology for storage of information such as computer readable instructions or other data. Memory 918 and storage 920 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 912. Any such computer storage media is part of device 912.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 912 includes input device(s) 924 such as keyboard, mouse, pen, voice input device, touch input device, infrared cameras, video input devices, or any other input device. Output device(s) 922 such as one or more displays, speakers, printers, or any other output device are also included in device 912. Input device(s) 924 and output device(s) 922 are connected to device 912 via a wired connection, wireless connection, or any combination thereof. In an embodiment, an input device or an output device from another computing device are used as input device(s) 924 or output device(s) 922 for computing device 912. Device 912 also includes communication connection(s) 926 to facilitate communications with one or more other devices.

Figure 10:
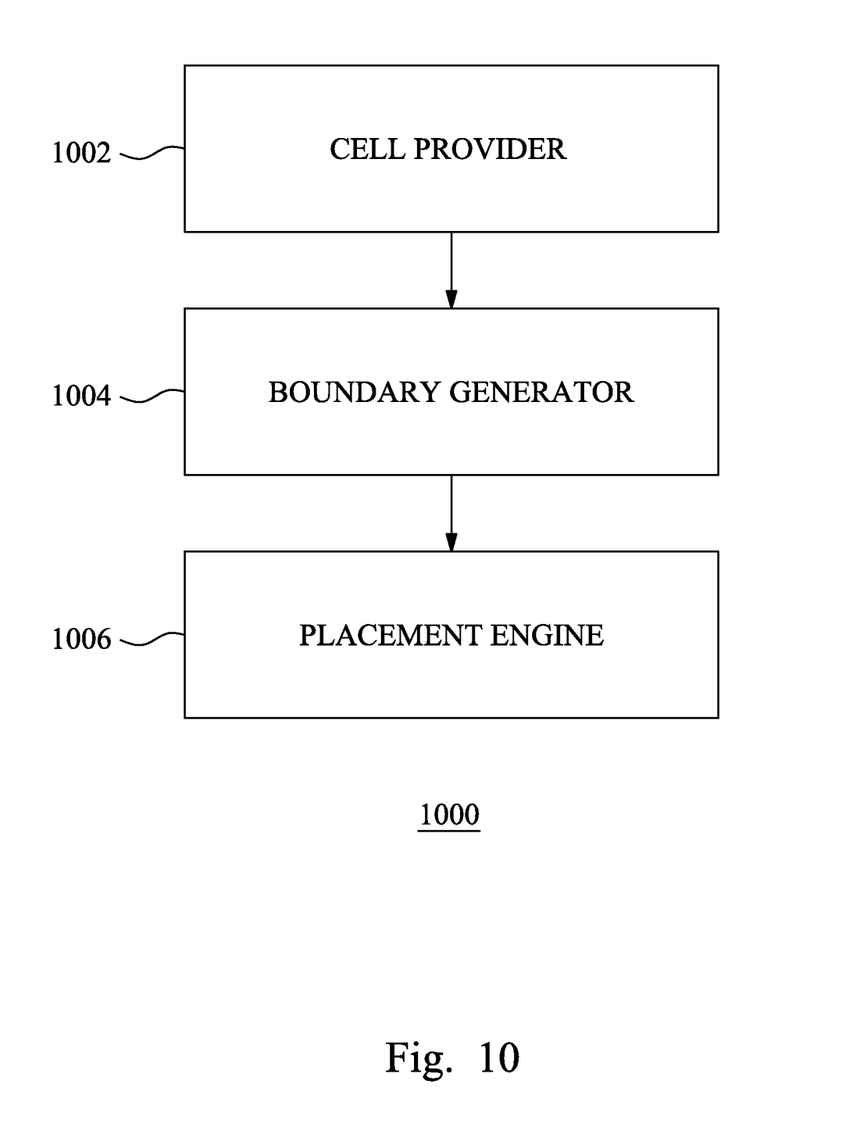
FIG. 10 is a block of a system for cell placement in a semiconductor layout in accordance with some embodiments.

FIG. 10 is a block of a system for cell placement in a semiconductor layout in accordance with some embodiments. A system 1000 for cell placement in a semiconductor layout is provided. The system 1000 includes: a cell provider 1002 configured to providing a first cell having two sides, each side configured as at least one of a source side and a drain side, and to provide a second cell having two sides, each side configured as at least one of a source side and a drain side; a boundary generator 1004 configured to provide a place-and-route boundary (prBoundary) of the first cell based on the configuration of the two sides of the first cell, and to provide a prBoundary of the second cell based on the configuration of the two sides of the second cell; and a placement engine 1006 configured to place the first cell and the second cell based on the prBoundary of the first cell and the prBoundary of the second cell.

According to an embodiment, a method for cell placement in a semiconductor layout is provided. The method includes: providing a first cell having two sides, each side configured as at least one of a source side and a drain side; providing a place-and-route boundary (prBoundary) of the first cell based on the configuration of the two sides of the first cell; providing a second cell having two sides, each side configured as at least one of a source side and a drain side; providing a prBoundary of the second cell based on the configuration of the two sides of the second cell; and placing the first cell and the second cell based on the prBoundary of the first cell and the prBoundary of the second cell.

According to an embodiment, a non-transitory computer-readable storage medium comprising computer-executable instructions. When the instructions are executed, a method for cell placement in a semiconductor layout is provided. The method includes: providing a first cell having two sides, each side configured as at least one of a source side and a drain side; providing a place-and-route boundary (prBoundary) of the first cell based on the configuration of the two sides of the first cell; providing a second cell having two sides, each side configured as at least one of a source side and a drain side; providing a prBoundary of the second cell based on the configuration of the two sides of the second cell; and placing the first cell and the second cell based on the prBoundary of the first cell and the prBoundary of the second cell.

According to an embodiment, a system for cell placement in a semiconductor layout is provided. The system includes: a cell provider configured to providing a first cell having two sides, each side configured as at least one of a source side and a drain side, and to provide a second cell having two sides, each side configured as at least one of a source side and a drain side; a boundary generator configured to provide a place-and-route boundary (prBoundary) of the first cell based on the configuration of the two sides of the first cell, and to provide a prBoundary of the second cell based on the configuration of the two sides of the second cell; and a placement engine configured to place the first cell and the second cell based on the prBoundary of the first cell and the prBoundary of the second cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for cell placement in a semiconductor layout, comprising:
providing a first cell and a second cell, each cell having opposite first and second sides and first and second active areas;
determining, for each side of each cell, a connection configuration that defines what the first and second active areas of the respective cell are coupled to at the respective side;
providing a place-and-route boundary (prBoundary) to each of the first and second cells, each prBoundary having
a first side edge adjacent the first side of the corresponding cell and
a second side edge adjacent the second side of the corresponding cell;
designating, for each cell,
a position of the first side edge of the prBoundary of the respective cell based on the connection configuration of the first side of the respective cell, and
a position of the second side edge of the prBoundary of the respective cell based on the connection configuration of the second side of the respective cell; and
placing the first cell and the second cell in the semiconductor layout based on the prBoundary of the first cell and the prBoundary of the second cell;
wherein the first and second cells are fabricated.

2. The method of claim 1, further comprising connecting the first active area of a PMOS at the source side to a power supply.

3. The method of claim 1, further comprising connecting the second active area of a NMOS at the source side to a ground.

4. The method of claim 1, wherein, for each side of each cell, the connection configuration is determined to be (i) a source side if, at the respective side, the first and second active areas are coupled to different power rails, and (ii) a drain side if, at the respective side, the first and second active areas are coupled together, and wherein designating the position for each side edge includes:
overlapping the respective side edge with the corresponding cell's first active area when the adjacent side is a source side; and
separating the respective side edge from the corresponding cell's first active area when the adjacent side is a drain side.

5. The method of claim 4, wherein separating the respective side edge comprises separating the respective side edge from the corresponding cell's first active area by a unit distance relative to a pitch of poly gates.

6. The method of claim 1, wherein placing the first cell and the second cell includes placing the first cell and the second cell such that one of the side edges of the prBoundary of the first cell is aligned with one of the side edges of the prBoundary of the second cell.

7. The method of claim 1, wherein placing the first cell and the second cell includes when a source side of the first cell is to be placed adjacent to a source side of the second cell, overlapping the first active areas of the first cell and the second cell.

8. The method of claim 1, wherein placing the first cell and the second cell includes when a drain side of the first cell is to be placed adjacent to a source side of the second cell, separating the first active areas of the first cell and the second cell.

9. The method of claim 1, further comprising:
providing a dummy poly gate at a drain side of the first cell; and providing a computer aided design (CAD) layer at the dummy poly gate.

10. The method of claim 1, wherein the providing, determining and placing steps are performed by a CAD application.

11. A method for cell placement in a semiconductor layout, comprising:
providing a first cell and a second cell, each cell having opposite first and second sides and first and second active areas;
determining, for each side of each cell, a connection configuration that defines what the first and second active areas of the respective cell are coupled to at the respective side;
providing a place-and-route boundary (prBoundary) to each of the first and second cells, each prBoundary having
a first side edge adjacent the first side of the corresponding cell and
a second side edge adjacent the second side of the corresponding cell;
designating, for each cell,
a position of the first side edge of the prBoundary of the respective cell based on the connection configuration of the first side of the respective cell, and
a position of the second side edge of the prBoundary of the respective cell based on the connection configuration of the second side of the respective cell;
placing the first cell and the second cell in the semiconductor layout based on the prBoundary of the first cell and the prBoundary of the second cell;
connecting active area of a PMOS at the source side to a power supply; and
connecting active area of a NMOS at the source side to a ground;
wherein the first and second cells are fabricated.

12. The method of claim 11, wherein, for each side of each cell, the connection configuration is determined to be (i) a source side if, at the respective side, the first and second active areas are coupled to different power rails, and (ii) a drain side if, at the respective side, the first and second active areas are coupled together, and wherein designating the position for each side edge includes:
overlapping the respective side edge with the corresponding cell's first active area when the adjacent side is a source side; and
separating the respective side edge from the corresponding cell's first active area when the adjacent side is a drain side.

13. The method of claim 12, wherein separating the respective side edge comprises separating the respective side edge from the corresponding cell's first active area by a unit distance relative to a pitch of poly gates.

14. The method of claim 11, wherein placing the first cell and the second cell includes placing the first cell the second cell such that one of the side edges of the prBoundary of the first cell is aligned with one of the side edges of the prBoundary of the second cell.

15. The method of claim 11, wherein placing the first cell and the second cell includes when a source side of the first cell is to be placed adjacent to a source side of the second cell, overlapping the first active areas of the first cell and the second cell.

16. The method of claim 11, wherein placing the first cell and the second cell includes when a drain side of the first cell is to be placed adjacent to a source side of the second cell, separating the first active areas of the first cell and the second cell.

17. The method of claim 11, further comprising:
providing a dummy poly gate at a drain side of the first cell; and
providing a computer aided design (CAD) layer at the dummy poly gate.

18. A system for cell placement in a semiconductor layout, comprising:
a cell provider configured to:
provide a first cell and a second cell, each cell having opposite first and second sides and first and second active areas, and
determine, for each side of each cell, a connection configuration that defines what the first and second active areas of the respective cell are coupled to at the respective side;
a boundary generator configured to:
provide a place-and-route boundary (prBoundary) to each of the first and second cells, each prBoundary having
a first side edge adjacent the first side of the corresponding cell and
a second side edge adjacent the second side of the corresponding cell;
designate, for each cell,
a position of the first side edge of the prBoundary of the respective cell based on the connection configuration of the first side of the respective cell, and
a position of the second side edge of the prBoundary of the respective cell based on the connection configuration of the second side of the respective cell;
a placement engine configured to place the first cell and the second cell in the semiconductor layout based on the prBoundary of the first cell and the prBoundary of the second cell; and
a mechanism configured to fabricate the first and second cells.

19. The system of claim 18, wherein, for each side of each cell, the connection configuration is determined by the cell provider to be (i) a source side if, at the respective side, the first and second active areas are coupled to different power rails, and (ii) a drain side if, at the respective side, the first and second active areas are coupled together.

20. The system of claim 19, wherein designating the position for each side edge by the boundary generator includes (i) overlapping the respective side edge with the corresponding cell's first active area when the adjacent side is a source side, and (ii) separating the respective side edge from the corresponding cell's first active area when the adjacent side is a drain side; and wherein positioning the first and second cell by the placement engine includes aligning one of the side edges of the prBoundary of the first cell with one of the side edges of the prBoundary of the second cell.

* * * * *